United States Patent [19]

Kawakami et al.

[11] Patent Number: 4,883,705

[45] Date of Patent: Nov. 28, 1989

[54] COMPOSITION FOR CERAMIC SUBSTRATE AND SUBSTRATE

[75] Inventors: Keiichi Kawakami; Mitsuo Takabatake; Jiro Chiba, all of Yokohama, Japan

[73] Assignee: Asahi Glass Company Ltd., Tokyo, Japan

[21] Appl. No.: 215,528

[22] Filed: Jul. 6, 1988

Related U.S. Application Data

[62] Division of Ser. No. 44,738, May 1, 1987, Pat. No. 4,777,092.

[30] Foreign Application Priority Data

May 2, 1986 [JP] Japan .................................. 61-101061
Nov. 11, 1986 [JP] Japan .................................. 61-266702

[51] Int. Cl.$^4$ ................................................ B32B 9/00
[52] U.S. Cl. .................................... 428/209; 428/426; 428/428; 428/432; 428/901; 501/32
[58] Field of Search ................... 507/32; 428/426, 428, 428/901, 209, 432

[56] References Cited

U.S. PATENT DOCUMENTS

| | | | |
|---|---|---|---|
| 2,898,395 | 8/1959 | Schurecht | 501/39 |
| 4,133,690 | 1/1979 | Muller | 501/32 |
| 4,593,006 | 6/1986 | Takabetake et al. | 501/77 |
| 4,618,590 | 10/1986 | Baudry | 501/26 |
| 4,743,302 | 5/1988 | Dumesnil et al. | 428/426 |
| 4,777,092 | 10/1988 | Kawakami et al. | 428/428 |

*Primary Examiner*—Ellis P. Robinson
*Assistant Examiner*—P. J. Ryan
*Attorney, Agent, or Firm*—Oblon, Spivak, McClelland, Maier & Neustadt

[57] ABSTRACT

A composition for a ceramic substrate comprising from 30 to 70% by weight of glass powder, from 28 to 70% by weight of refractory filler powder and an oxidizing agent, said glass powder consisting essentially of from 38 to 48% by weight of $SiO_2$, from 1 to 8% by weight of $Al_2O_3$, from 0 to 10% by weight of MgO, from 18 to 28% by weight of BaO, from 1 to 8% by weight of CaO, from 0 to 15% by weight of SrO, from 0.5 to 15% by weight of $B_2O_3$, from 0 to 20% by weight of PbO, from 10 to 20% by weight of ZnO, from 0 to 7% by weight of $TiO_2$ plus $ZrO_2$ and from 0 to 5% by weight of $Li_2O$ plus $Na_2O$ plus $K_2O$, and said refractory filler powder comprising from 20 to 60% by weight of alumina, from 0 to 40% by weight of zircon, from 0 to 30% by weight of cordierite and from 0 to 30% by weight of forsterite.

9 Claims, No Drawings

COMPOSITION FOR CERAMIC SUBSTRATE AND SUBSTRATE

This is a division of application Ser. No. 044,738, filed May 1, 1987 now U.S. Pat. No. 4,777,092.

BACKGROUND OF THE INVENTION

1. Field of the Invention

The present invention relates to a composition for a ceramic substrate and a substrate prepared from the composition. More particularly, the present invention relates to a composition which can be sintered at a low temperature of not higher than 1,000° C. in a non-oxidizing atmosphere, and a substrate prepared from such a composition.

2. Discussion of Background

Electronic devices are known which are prepared by printing a conductive paste in predetermined patterns on green sheets of glass ceramic and laminating a plurality of such printed green sheets, followed by sintering to form a multi-layer circuit board or substrate. In such electronic devices, the conductive connection between the respective conductive layers is established either by printing a conductive paste in viaholes preliminarily formed in the green sheets or by filling a conductive substance in such via holes.

As such a conductive paste, a Au paste, a Ag-Pd paste and a Cu paste are known. However, the Au paste has a drawback that it is expensive. The Ag-Pd paste has a drawback that the electrical resistance is high, and the electrical migration tends to appear. The Cu paste has merits such that the electrical resistance is low, and the electrical migration of the formed conductor does not tend to appear, and it is hardly corroded by soldering. However, copper is susceptible to oxidation. In order to avoid the oxidation, the sintering for the formation of the conductor is usually conducted in a nitrogen atmosphere having an oxygen concentration of not higher than 10 ppm.

The following compositions have been known, whereby an organic binder in the green sheets can be removed by sintering them in such a non-oxidizing atmosphere.

Japanese unexamined patent publication No. 36363/1985 discloses a composition comprising glass powder containing $SiO_2$, $Al_2O_3$, MgO, BaO, $B_2O_3$ and $Bi_2O_3$, and an oxidizing agent added thereto. Japanese unexamined patent publication No. 38882/1980 discloses a composition comprising glass powder containing $SiO_2$, $Al_2O_3$, ZnO, CaO, SrO and $B_2O_3$, and an oxidizing agent. Further, West German Pat. No. 2,755,935 discloses a composition containing $SiO_2$, $Al_2O_3$, ZnO, CaO, SrO and $B_2O_3$. However, in each case, when the composition is sintered in a non-oxidizing atmosphere, the removal of the organic binder in the composition is inadequate, and carbon remains, whereby the electrical properties such as the breakdown voltage and the dielectric constant, are poor.

SUMMARY OF THE INVENTION

It is an object of the present invention to provide a ceramic composition which can be sintered at a low temperature of from 850 to 1,000° C. in a non-oxidizing atmosphere, and which is capable of providing a sintered substrate having properties required for a circuit board, such as a high breakdown voltage, a high insulation resistance, a small dielectric constant and a high flexural strength.

The present inventors have found that the above object can be accomplished by a composition obtained by incorporating certain refractory filler powder and oxidizing agent to glass powder of $SiO_2$—$Al_2O_3$—BaO—CaO—$B_2O_3$—ZnO type.

The present invention provides a composition for a ceramic substrate comprising from 30 to 70% by weight of glass powder, from 28 to 70% by weight of refractory filler powder and an oxidizing agent, said glass powder consisting essentially of from 38 to 48% by weight of $SiO_2$, from 1 to 8% by weight of $Al_2O_3$, from 0 to 10% by weight of MgO, from 18 to 28% by weight of BaO, from 1 to 8% by weight of CaO, from 0 to 15% by weight of SrO, from 0.5 to 15% by weight of $B_2O_3$, from 0 to 20% by weight of PbO, from 10 to 20% by weight of ZnO, from 0 to 7% by weight of $TiO_2$ plus $ZrO_2$ and from 0 to 5% by weight of $Li_2O$ plus $Na_2O$ plus $K_2O$, and said refractory filler powder comprising from 20 to 60% by weight of alumina, from 0 to 40% by weight of zircon, from 0 to 30% by weight of cordierite and from 0 to 30% by weight of forsterite.

The present invention also provides a substrate prepared by forming a green sheet from a slurry comprising an inorganic component and an organic binder, printing a copper paste in a predetermined pattern on the green sheet, and sintering the printed green sheet in a substantially non-oxidizing atmosphere, wherein the inorganic component is made of the above composition.

Further, the present invention provides a multi-layer substrate prepared by forming green sheets from a slurry comprising an inorganic component and an organic binder, printing a copper paste in a predetermined pattern on each green sheet, laminating the printed green sheets, and sintering the laminated green sheets in a substantially non-oxidizing atmosphere, wherein the inorganic component is made of the above composition.

DETAILED DESCRIPTION OF THE PREFERRED EMBODIMENTS

In the following description in this specification, "%" means "% by weight" unless otherwise specified.

The oxidizing agent incorporated in the present invention has a function to oxidize and remove the organic binder in the composition (the binder-removal effect) when the composition is sintered in a non-oxidizing atmosphere having an oxygen concentration of not higher than about 20 ppm, to obtain the substrate.

The oxidizing agent is incorporated preferably in an amount of from 0.01 to 20% relative to the inorganic component i.e. the total amount of the glass powder and the refractory filler powder. If the amount of the oxidizing agent is less than 0.01%, there will be no distinct effectiveness of the incorporation. On the other hand, if the amount exceeds 20%, the breakdown voltage characteristic of the substrate tends to deteriorate, and the oxidizing effect will be so strong that the printed conductive patterns of e.g. copper are likely to be oxidized during sintering, such being undesirable. The amount of the oxidizing agent is more preferably within a range of from 0.05 to 15%, most preferably from 1 to 10%. As the oxidizing agent, $CeO_2$, $TiO_2$, $BaO_2$, $SnO_2$, $CaO_2$ or $V_2O_5$ may be used. Particularly preferred is $CeO_2$.

On the other hand, if the content of the glass powder in the inorganic component is less than 30%, it will be difficult to obtain an adequately dense sintered substrate, whereby the electrical properties tend to deteriorate. On the other hand, if the content exceeds 70%, the flexural strength of the sintered substrate tends to be low, and the reactivity with the conductor such as copper tends to increase, and the wettability of the conductor such as copper to solder tends to be impaired, such being undesirable. Within the above range, a range of from 30 to 70% is preferred, a range of from 50 to 65% is particularly preferred.

The refractory filler powder is incorporated to strengthen the flexural strength of the substrate. If the amount is less than 28%, the flexural strength tends to be poor, and if it exceeds 70%, the sintering property tends to be poor.

The refractory filler powder preferably comprises from 20 to 60% of alumina, from 0 to 40% of zircon, from 0 to 30% of cordierite and from 0 to 30% of forsterite.

If alumina is less than 20%, the flexural strength tends to deteriorate, and if it exceeds 60%, the sintering property tends to be poor, and the dielectric constant tends to increase. A preferred range is from 30 to 55%.

Zircon may be added to increase the flexural strength and to minimize the thermal expansion. If the amount exceeds 40%, the sintering property tends to be poor. The amount is preferably from 0 to 20%.

Cordierite is incorporated to minimize the thermal expansion and to minimize the dielectric constant. However, if the amount exceeds 30%, the sintering property tends to be poor. A preferred range is from 0 to 20%.

Forsterite is incorporated to minimize the dielectric constant. However, if it is added in an amount exceeding 30%, the sintering property will also be poor. The amount is preferably from 0 to 20%.

The glass powder having the following composition is used for the reasons given below.
$SiO_2$: 38-48%
$Al_2O_3$: 1-8%
MgO: 0-10%
CaO: 1-8%
SrO: 0-15%
BaO: 18-28%
PbO: 0-20%
ZnO: 10-20%
$B_2O_3$: 0.5-15%
$TiO_2+ZrO_2$: 0-7%
$Li_2O+Na_2O+K_2O$: 0-5%

If the amount of $SiO_2$ is less than 38%, the dielectric constant of the sintered substrate tends to be too large, and if it exceeds 48%, the sintering temperature tends to be too high. A preferred range is from 40 to 47% by weight.

If the amount of $Al_2O_3$ is less than 1%, the moisture resistance of the sintered substrate tends to be poor, and if it exceeds 8%, devitrification is likely to result during the preparation of glass frit. A preferred range is from 2 to 7%.

CaO and BaO are components for controlling the solubility and the thermal expansion coefficient for the preparation of the glass powder. The solubility of the glass powder tends to be poor if the content of CaO or BaO is less than 1% or 18%, respectively. On the other hand, if caO or BaO exceeds 8% or 28%, respectively, the thermal expansion coefficient and the dielectric constant of the substrate tend to be too large, such being undesirable. Preferably BaO is within a range of from 22 to 28%, and CaO is from 2 to 7%.

MgO and SrO have substantially the same effect as CaO and BaO. If MgO or SrO exceeds 10% or 15%, respectively, devitrification is likely to result when glass is melted. Preferably, MgO is from 0 to 7%, and SrO is from 0 to 10%. More preferably, MgO is from 2 to 7%, and SrO is from 2 to 10%.

By the addition of PbO, the glass softening temperature lowers, and the sintering temperature of the substrate lowers. However, if the amount exceeds 20%, the dielectric constant of the substrate tends to be too large, and the removal of the organic binder tends to be inadequate and carbon is likely to remain, such being undesirable. A preferred range is from 0 to 18%, and a more preferred range is from 1 to 18%.

$B_2O_3$ is a flux component. If the amount is less than 0.5%, no adequate effect will be obtained as a flux. If the amount of $B_2O_3$ exceeds 15%, the removal of the organic binder tends to be inadequate, and carbon is likely to remain, although the dielectric constant decreases and the electrical properties will be improved. A preferred range is from 1 to 8%.

By the addition of ZnO, the glass softening temperature lowers, and the sintering temperature of the substrate lowers, such being desirable. However, if the amount exceeds 20%, the dielectric constant of the substrate increases, and if the amount is less than 10%, the glass softening temperature tends to be high, such being undesirable. A preferred range is from 12 to 20%.

$TiO_2+ZrO_2$ are not essential components. However, by their addition, the crystallinity can advantageously be adjusted. If the amount exceeds 7%, the softening temperature of glass tends to be too high, or the dielectric constant of the substrate tends to be large. A preferred range is not higher than 5%.

$Li_2O+Na_2O+K_2O$ are not essential components, but they are preferably employed for the improvement of the solubility of glass. However, from the viewpoint of electrical migration, the amount is preferably less than 3%.

Within the above-mentioned ranges, it is particularly preferred to employ a glass powder having the following composition and from 1 to 10% of $CeO_2$ as the oxidizing agent, in view of the dielectric constant, the dielectric loss tangent, the removal of binder and the flexural strength.
$SiO_2$: 40-47%
$Al_2O_3$: 2-7%

MgO: 0–7%
CaO: 2–7%
SrO: 0–10%
BaO: 22–28%
PbO: 0–18%
ZnO: 12–20%
$B_2O_3$: 4–7%
$TiO_2+ZrO_2$: 0–4%
$Li_2O+Na_2O+K_2O$: 0–3%

In the present invention, there is no particular restriction as to the particle size of each powder such as glass powder, and the particle size is usually within a range of from 0.5 to 5 μm. Among them, the average particle size of the glass powder is preferably within a range of from 1 to 4 μm, and the average particle sizes of the refractory filler powder and the oxidizing agent are preferably within a range of from 0.5 to 3 μm. If the average particle size of the glass powder is less than 1 μm, the firing shrinkage tends to increase, and the shrinkage variance tends to increase, such being undesirable. On the other hand, if the particle size exceeds 4 μm, it becomes difficult to attain densification of the sintered structure. If the average particle size of the refractory filler powder or the oxidizing agent is less than 0.5 μm, such a material tends to be hardly available, or tends to be expensive, and if it exceeds 3 μm, it becomes difficult to attain densification of the sintered structure.

A substrate can be produced from the composition of the present invention, for example, as follows.

To the composition of the present invention, an organic binder, a plasticizer and a solvent are added, and the mixture is kneaded to obtain a slurry. As the organic binder, a usual binder such as a butyral resin or an acrylic resin may be used. As the plasticizer, a usual plasticizer such as dibutyl phthalate, dioctyl phthalate or butyl benzylphthalate, may be used. Likewise, as the solvent, a usual solvent such as toluene or an alcohol may be used.

Then, the slurry is cast into a sheet and dried to obtain a non-sintered sheet i.e. a so-called green sheet. Then, via holes are formed in this green sheet, and on one side of the sheet, a copper paste is printed in a predetermined circuit pattern with a certain thickness. By this printing, the copper paste is filled in the via holes. The filling of the paste into the via holes may be conducted in a step separate from the step of printing the circuit pattern. Then, a predetermined number of such printed green sheets are laminated and subjected to heat pressing for integration, followed by sintering so that the green sheets and the circuit are sintered. The laminated green sheets are sintered in a non-oxidizing atmosphere having an oxygen concentration of not higher than 20 ppm at a temperature of from 850 to 1,000° C. for from 10 minutes to 1 hour.

Now, the present invention will be described in further detail with reference to Examples. However, it should be understood that the present invention is by no means restricted to these specific Examples.

EXAMPLES

Glass compositions as identified by Sample Nos. 1 to 59 and Comparative Sample Nos. 1 to 14 in Table 1 were prepared.

Each composition was introduced in a platinum crucible and heated and melted under stirring at a temperature of from 1,400 to 1,500° C. for 2 to 4 hours. Then, the glass composition was pulverized in water. Further, by means of a pulverization apparatus, the refractory filler, the glass powder and the oxidizing agent were pulverized and mixed to obtain the predetermined proportions.

Then, a methyl methacrylate resin as an organic binder, dibutyl phthalate as a plasticizer and toluene as a solvent were added thereto, and the mixture was kneaded to obtain a slurry having a viscosity of from 10,000 to 30,000 cps. Then, this slurry was cast into sheets having a thickness of about 0.2 mm, followed by drying at 70° C. for 2 hours. A copper paste was screen printed on such sheets. Ten such sheets were laminated and subjected to heat pressing at 70° C. under a pressure of 100 kg/cm². Then, the laminate thus obtained was sintered at a maximum temperature of 900° C. for the peak period of 10 minutes at an oxygen concentration of 5 ppm under a nitrogen stream at a flow rate of 20 liter/minute to obtain a multi-layer substrate. With respect to this multi-layer substrate, the breakdown voltage (kV/mm), the insulation resistance (Ω), the dielectric constant and the dielectric loss tangent (%) at 1 MHz, the thermal expansion coefficient (/° C.) from 25 to 500° C., the flexural strength (kg/cm²) by three-point bending test, the presence or absence of blackening of the substrate by visual observation, and the residual carbon concentration (ppm) by carbon analysis, were obtained and shown in Table 1.

In Table 1, Sample Nos. 24 to 28 and 42 show the effects of oxidizing agents other than $CeO_2$ with an addition of a small amount of $B_2O_3$. It is evident that as compared with $CeO_2$, the residual carbon is substantial although no blackening was observed.

From the comparison of Example 11 with Examples 24 to 28, it is evident that in spite of the same composition except for the oxidizing agent, the amount of the residual carbon is much greater in Examples 24 to 28 than in Example 11, and Example 11 is far superior also in the breakdown voltage. Thus, it is evident that $CeO_2$ is very effective as the oxidizing agent. As the oxidizing agent, $CeO_2$ is far superior in the effectiveness to other oxidizing agents, and thus suitable for a multi-layer substrate wherein a Cu paste is used for the formation of the conductive printed circuit.

The properties were evaluated by the following methods.

Breakdown votange:

By using a direct current voltage generator manufactured by Kikusui Denshi K. K., the voltage was raised at a rate of 100 V per minute, whereby the insulation breakdown voltage was measured. Temperature: 25±1° C., humidity: 45±1%, distance of the measured patterns: 0.17 mm Insulation resistance:

By using a vibration volume type microampere meter manufactured by Takeda Riken K. K., the value for one minute after application of 100 V was measured. Temperature: 25±1° C., humidity: 45±1%, distance of the measured patterns: 0.17 mm Dielectric constant and dielectric loss tangent:

Measured by an AC bridge manufactured by Ando Denki K. K. The characteristic under 1 MHz was measured and evaluated. Temperature: 25±1° C., humidity: 45±1%

Thermal expansion coefficient:

The thermal expansion from 25° C., to 500° C. was measured and evaluated by a thermal expansion meter manufactured by Sinku Riko K. K.

Flexural strength:

Measured by a strength tester manufactured by Toyo Boldwin K. K. A sintered substrate was cut into a size of 10 mm width and 50 mm in length, and placed on two bearing points spaced with a distance of 20 mm from each other, and a load was exerted at a rate of 0.5 mm/min. to the center between the bearing points, whereby the load at the breakage was measured and evaluated.

Presence or absence of blackening:

The case where blackening was visually observed is identified by "B" (black), and the case where no blackening was visually observed is identified by "W" (white).

Residual carbon:

By using a carbon analyzer manufactured by LECO Company, the amount of carbon in the ceramic powder obtained by pulverizing the substrate was measured.

TABLE 1

| Sample No. | | 1 | 2 | 3 | 4 | 5 |
|---|---|---|---|---|---|---|
| Composition (%) | Alumina | 20 | 38 | 48 | 58 | 20 |
| | Zircon | 0 | 0 | 0 | 0 | 8 |
| | Forsterite | 4 | 0 | 0 | 0 | 0 |
| | Cordierite | 4 | 0 | 0 | 0 | 0 |
| | Glass | 70 | 60 | 50 | 40 | 70 |
| Glass composition (%) | $SiO_2$ | 43 | 43 | 43 | 43 | 43 |
| | $Al_2O_3$ | 5 | 5 | 5 | 5 | 5 |
| | MgO | 0 | 0 | 0 | 0 | 0 |
| | CaO | 5 | 5 | 5 | 5 | 5 |
| | SrO | 0 | 0 | 0 | 0 | 0 |
| | BaO | 27 | 27 | 27 | 27 | 27 |
| | PbO | 0 | 0 | 0 | 0 | 0 |
| | ZnO | 15 | 15 | 15 | 15 | 15 |
| | $B_2O_3$ | 5 | 5 | 5 | 5 | 5 |
| | $TiO_2 + ZrO_2$ | 0 | 0 | 0 | 0 | 0 |
| | $Li_2O + Na_2O + K_2O$ | 0 | 0 | 0 | 0 | 0 |
| Oxidizing agent (%) | $CeO_2$ | 2 | 2 | 2 | 2 | 2 |
| Properties | BV (kV/mm) | 17 | 20 | 25 | 22 | 23 |
| | IR (Ω) | $4 \times 10^{12}$ | $5 \times 10^{12}$ | $2 \times 10^{13}$ | $9 \times 10^{12}$ | $1 \times 10^{13}$ |
| | DC | 6.5 | 7.4 | 7.5 | 7.5 | 6.7 |
| | DLT (%) | 0.3 | 0.1 | 0.1 | 0.2 | 0.2 |
| | TEC ($\times 10^{-7}$/°C.) | 59 | 63 | 64 | 66 | 59 |
| | FS (kg/cm$^2$) | 1300 | 1700 | 2100 | 2300 | 1500 |
| | Color | W | W | W | W | W |
| | RC (ppm) | 240 | 180 | 170 | 120 | 240 |
| Sample No. | | 6 | 7 | 8 | 9 | 10 |
| Composition (%) | Alumina | 25 | 28 | 38 | 38 | 38 |
| | Zircon | 23 | 40 | 0 | 0 | 0 |
| | Forsterite | 0 | 0 | 10 | 0 | 30 |
| | Cordierite | 0 | 0 | 10 | 30 | 0 |
| | Glass | 50 | 30 | 40 | 30 | 30 |
| Glass composition (%) | $SiO_2$ | 43 | 43 | 43 | 43 | 43 |
| | $Al_2O_3$ | 5 | 5 | 5 | 5 | 5 |
| | MgO | 0 | 0 | 5 | 0 | 0 |
| | CaO | 5 | 5 | 5 | 5 | 5 |
| | SrO | 0 | 0 | 0 | 0 | 0 |
| | BaO | 27 | 27 | 27 | 27 | 27 |
| | PbO | 0 | 0 | 0 | 0 | 0 |
| | ZnO | 15 | 15 | 15 | 15 | 15 |
| | $B_2O_3$ | 5 | 5 | 5 | 5 | 5 |
| | $TiO_2 + ZrO_2$ | 0 | 0 | 0 | 0 | 0 |
| | $Li_2O + Na_2O + K_2O$ | 0 | 0 | 0 | 0 | 0 |
| Oxidizing agent (%) | $CeO_2$ | 2 | 2 | 2 | 2 | 2 |
| | BV (kV/mm) | 24 | 18 | 20 | 15 | 17 |
| | IR (Ω) | $2 \times 10^{13}$ | $2 \times 10^{12}$ | $3 \times 10^{12}$ | $1 \times 10^{12}$ | $1 \times 10^{12}$ |

TABLE 1-continued

|  |  | | | | | |
|---|---|---|---|---|---|---|
| Properties | DC | 7.2 | 7.5 | 7.1 | 6.5 | 7.0 |
|  | DLT (%) | 0.2 | 0.2 | 0.2 | 0.3 | 0.2 |
|  | TEC ($\times 10^{-7}$/°C.) | 60 | 64 | 63 | 58 | 66 |
|  | FS (kg/cm$^2$) | 2000 | 2000 | 2000 | 1500 | 1600 |
|  | Color | W | W | W | W | W |
|  | RC (ppm) | 170 | 100 | 120 | 100 | 100 |

| Sample No. | | 11 | 12 | 13 | 14 | 15 |
|---|---|---|---|---|---|---|
| Composition (%) | Alumina | 49 | 49 | 49 | 49 | 49 |
|  | Zircon | 0 | 0 | 0 | 0 | 0 |
|  | Forsterite | 0 | 0 | 0 | 0 | 0 |
|  | Cordierite | 0 | 0 | 0 | 0 | 0 |
|  | Glass | 49 | 49 | 49 | 49 | 49 |
| Glass composition (%) | SiO$_2$ | 43 | 43 | 43 | 43 | 43 |
|  | Al$_2$O$_3$ | 5 | 5 | 5 | 5 | 5 |
|  | MgO | 0 | 0 | 0 | 0 | 0 |
|  | CaO | 5 | 4 | 4 | 4 | 4 |
|  | SrO | 0 | 0 | 0 | 0 | 0 |
|  | BaO | 27 | 25 | 25 | 24 | 23 |
|  | PbO | 0 | 0 | 0 | 0 | 0 |
|  | ZnO | 15 | 20 | 18 | 14 | 10 |
|  | B$_2$O$_3$ | 5 | 3 | 5 | 10 | 15 |
|  | TiO$_2$ + ZrO$_2$ | 0 | 0 | 0 | 0 | 0 |
|  | Li$_2$O + Na$_2$O + K$_2$O | 0 | 0 | 0 | 0 | 0 |
| Oxidizing agent (%) | CeO$_2$ | 2 | 2 | 2 | 2 | 2 |
| Properties | BV (kV/mm) | 25 | 25 | 26 | 19 | 15 |
|  | IR (Ω) | $2 \times 10^{13}$ | $2 \times 10^{13}$ | $2 \times 10^{13}$ | $5 \times 10^{12}$ | $1 \times 10^{12}$ |
|  | DC | 7.5 | 7.7 | 7.5 | 7.1 | 6.9 |
|  | DLT (%) | 0.1 | 0.1 | 0.1 | 0.1 | 0.1 |
|  | TEC ($\times 10^{-7}$/°C.) | 65 | 65 | 66 | 65 | 64 |
|  | FS (kg/cm$^2$) | 2100 | 2100 | 2100 | 2000 | 1700 |
|  | Color | W | W | W | W | W |
|  | RC (ppm) | 170 | 150 | 170 | 240 | 270 |

| Sample No. | | 16 | 17 | 18 | 19 | 20 |
|---|---|---|---|---|---|---|
| Composition (%) | Alumina | 49.97 | 49.9 | 49.5 | 49 | 45 |
|  | Zircon | 0 | 0 | 0 | 0 | 0 |
|  | Forsterite | 0 | 0 | 0 | 0 | 0 |
|  | Cordierite | 0 | 0 | 0 | 0 | 0 |
|  | Glass | 50 | 50.0 | 50 | 50 | 50 |
| Glass composition (%) | SiO$_2$ | 43 | 43 | 43 | 43 | 43 |
|  | Al$_2$O$_3$ | 5 | 5 | 5 | 5 | 5 |
|  | MgO | 0 | 0 | 0 | 0 | 0 |
|  | CaO | 5 | 5 | 5 | 5 | 5 |
|  | SrO | 0 | 0 | 0 | 0 | 0 |
|  | BaO | 27 | 27 | 27 | 27 | 27 |
|  | PbO | 0 | 0 | 0 | 0 | 0 |
|  | ZnO | 15 | 15 | 15 | 15 | 15 |
|  | B$_2$O$_3$ | 5 | 5 | 5 | 5 | 5 |
|  | TiO$_2$ + ZrO$_2$ | 0 | 0 | 0 | 0 | 0 |
|  | Li$_2$O + Na$_2$O + K$_2$O | 0 | 0 | 0 | 0 | 0 |
| Oxidizing agent (%) | CeO$_2$ | 0.03 | 0.1 | 0.5 | 1 | 5 |
|  | TiO$_2$ | — | 0 | 0 | 0 | 0 |
|  | BaO$_2$ | — | 0 | 0 | 0 | 0 |
|  | SnO$_2$ | — | 0 | 0 | 0 | 0 |
|  | CaO$_2$ | — | 0 | 0 | 0 | 0 |
|  | V$_2$O$_5$ | — | 0 | 0 | 0 | 0 |
| Properties | BV (kV/mm) | 15 | 16 | 18 | 19 | 25 |
|  | IR (Ω) | $5 \times 10^{11}$ | $9 \times 10^{11}$ | $2 \times 10^{12}$ | $8 \times 10^{12}$ | $3 \times 10^{13}$ |
|  | DC | 7.4 | 7.4 | 7.4 | 7.5 | 7.6 |
|  | DLT (%) | 0.4 | 0.3 | 0.2 | 0.1 | 0.1 |
|  | TEC ($\times 10^{-7}$/°C.) | 63 | 63 | 63 | 65 | 67 |
|  | FS (kg/cm$^2$) | 1500 | 1800 | 2000 | 2100 | 2300 |
|  | Color | W | W | W | W | W |
|  | RC (ppm) | 280 | 250 | 230 | 200 | 160 |

| Sample No. | | 21 | 22 | 23 | 24 | 25 |
|---|---|---|---|---|---|---|
| Composition (%) | Alumina | 40 | 35 | 30 | 49 | 49 |
|  | Zircon | 0 | 0 | 0 | 0 | 0 |
|  | Forsterite | 0 | 0 | 0 | 0 | 0 |
|  | Cordierite | 0 | 0 | 0 | 0 | 0 |
|  | Glass | 50 | 50 | 50 | 49 | 49 |
|  | SiO$_2$ | 43 | 43 | 43 | 43 | 43 |
|  | Al$_2$O$_3$ | 5 | 5 | 5 | 5 | 5 |
|  | MgO | 0 | 0 | 0 | 0 | 0 |

TABLE 1-continued

| | | | | | | |
|---|---|---|---|---|---|---|
| Glass composition (%) | CaO | 5 | 5 | 5 | 5 | 5 |
| | SrO | 0 | 0 | 0 | 0 | 0 |
| | BaO | 27 | 27 | 27 | 27 | 27 |
| | PbO | 0 | 0 | 0 | 0 | 0 |
| | ZnO | 15 | 15 | 15 | 15 | 15 |
| | $B_2O_3$ | 5 | 5 | 5 | 5 | 5 |
| | $TiO_2 + ZrO_2$ | 0 | 0 | 0 | 0 | 0 |
| | $Li_2O + Na_2O + K_2O$ | 0 | 0 | 0 | 0 | 0 |
| | $CeO_2$ | 10 | 15 | 20 | 0 | 0 |
| Oxidizing agent (%) | $TiO_2$ | 0 | 0 | 0 | 2 | 0 |
| | $BaO_2$ | 0 | 0 | 0 | 0 | 2 |
| | $SnO_2$ | 0 | 0 | 0 | 0 | 0 |
| | $CaO_2$ | 0 | 0 | 0 | 0 | 0 |
| | $V_2O_5$ | 0 | 0 | 0 | 0 | 0 |
| Properties | BV (kV/mm) | 27 | 30 | 30 | 18 | 17 |
| | IR (Ω) | $4 \times 10^{13}$ | $1 \times 10^{14}$ | $1 \times 10^{14}$ | $1 \times 10^{13}$ | $1 \times 10^{13}$ |
| | DC | 7.9 | 8.1 | 8.2 | 7.5 | 7.5 |
| | DLT (%) | 0.3 | 0.5 | 0.8 | 0.2 | 0.2 |
| | TEC ($\times 10^{-7}/°C$) | 69 | 69 | 70 | 65 | 66 |
| | FS (kg/cm²) | 2300 | 2300 | 2200 | 1900 | 1800 |
| | Color | W | W | W | W | W |
| | RC (ppm) | 140 | 100 | 100 | 300 | 310 |

| Sample No. | | 26 | 27 | 28 | 29 | 30 |
|---|---|---|---|---|---|---|
| Composition (%) | Alumina | 49 | 49 | 49 | 49 | 49 |
| | Zircon | 0 | 0 | 0 | 0 | 0 |
| | Forsterite | 0 | 0 | 0 | 0 | 0 |
| | Cordierite | 0 | 0 | 0 | 0 | 0 |
| | Glass | 49 | 49 | 49 | 49 | 49 |
| Glass composition (%) | $SiO_2$ | 43 | 43 | 43 | 43 | 43 |
| | $Al_2O_3$ | 5 | 5 | 5 | 5 | 5 |
| | MgO | 0 | 0 | 0 | 0 | 0 |
| | CaO | 5 | 5 | 5 | 5 | 5 |
| | SrO | 0 | 0 | 0 | 0 | 0 |
| | BaO | 27 | 27 | 27 | 27 | 27 |
| | PbO | 0 | 0 | 0 | 0 | 0 |
| | ZnO | 15 | 15 | 15 | 13 | 12 |
| | $B_2O_3$ | 5 | 5 | 5 | 5 | 5 |
| | $TiO_2 + ZrO_2$ | 0 | 0 | 0 | 2 | 3 |
| | $Li_2O + Na_2O + K_2O$ | 0 | 0 | 0 | 0 | 0 |
| | $CeO_2$ | 0 | 0 | 0 | 2 | 2 |
| Oxidizing agent (%) | $TiO_2$ | 0 | 0 | 0 | 0 | 0 |
| | $BaO_2$ | 0 | 0 | 0 | 0 | 0 |
| | $SnO_2$ | 2 | 0 | 0 | 0 | 0 |
| | $CaO_2$ | 0 | 2 | 0 | 0 | 0 |
| | $V_2O_5$ | 0 | 0 | 2 | 0 | 0 |
| Properties | BV (kV/mm) | 17 | 16 | 16 | 24 | 25 |
| | IR (Ω) | $8 \times 10^{12}$ | $1 \times 10^{12}$ | $1 \times 10^{12}$ | $2 \times 10^{13}$ | $3 \times 10^{13}$ |
| | DC | 7.5 | 7.4 | 7.4 | 7.6 | 7.7 |
| | DLT (%) | 0.2 | 0.2 | 0.2 | 0.1 | 0.1 |
| | TEC ($\times 10^{-7}/°C$) | 65 | 65 | 66 | 65 | 64 |
| | FS (kg/cm²) | 1800 | 1900 | 2100 | 2100 | 2100 |
| | Color | W | W | W | W | W |
| | RC (ppm) | 310 | 340 | 340 | 170 | 180 |

| Sample No. | | 31 | 32 | 33 | 34 | 35 |
|---|---|---|---|---|---|---|
| Composition (%) | Alumina | 49 | 49 | 49 | 49 | 49 |
| | Zircon | 0 | 0 | 0 | 0 | 0 |
| | Forsterite | 0 | 0 | 0 | 0 | 0 |
| | Cordierite | 0 | 0 | 0 | 0 | 0 |
| | Glass | 49 | 49 | 49 | 49 | 49 |
| Glass composition (%) | $SiO_2$ | 43 | 43 | 43 | 43 | 43 |
| | $Al_2O_3$ | 5 | 5 | 5 | 5 | 5 |
| | MgO | 0 | 0 | 0 | 0 | 0 |
| | CaO | 5 | 5 | 5 | 5 | 5 |
| | SrO | 0 | 0 | 0 | 0 | 0 |
| | BaO | 27 | 27 | 27 | 27 | 27 |
| | PbO | 0 | 0 | 0 | 0 | 0 |
| | ZnO | 10 | 8 | 13 | 12 | 10 |
| | $B_2O_3$ | 5 | 5 | 5 | 5 | 5 |
| | $TiO_2 + ZrO_2$ | 5 | 7 | 0 | 0 | 0 |
| | $Li_2O + Na_2O + K_2O$ | 0 | 0 | 2 | 3 | 5 |
| | $CeO_2$ | 2 | 2 | 2 | 2 | 2 |
| Oxidizing agent (%) | $TiO_2$ | 0 | 0 | 0 | 0 | 0 |
| | $BaO_2$ | 0 | 0 | 0 | 0 | 0 |
| | $SnO_2$ | 0 | 0 | 0 | 0 | 0 |
| | $CaO_2$ | 0 | 0 | 0 | 0 | 0 |

TABLE 1-continued

| | | | | | | |
|---|---|---|---|---|---|---|
| | $V_2O_5$ | 0 | 0 | 0 | 0 | 0 |
| | BV (kV/mm) | 25 | 24 | 22 | 22 | 20 |
| | IR (Ω) | $2 \times 10^{13}$ | $2 \times 10^{13}$ | $9 \times 10^{12}$ | $9 \times 10^{12}$ | $5 \times 10^{12}$ |
| | DC | 7.7 | 7.7 | 7.6 | 7.7 | 7.9 |
| | DLT (%) | 0.1 | 0.1 | 0.2 | 0.2 | 0.3 |
| Properties | TEC ($\times 10^{-7}$/°C.) | 63 | 62 | 65 | 67 | 68 |
| | FS (kg/cm$^2$) | 2200 | 2200 | 2100 | 2200 | 2200 |
| | Color | W | W | W | W | W |
| | RC (ppm) | 170 | 170 | 180 | 200 | 210 |

| Sample No. | | 36 | 37 | 38 | 39 | 40 |
|---|---|---|---|---|---|---|
| Composition (%) | Alumina | 49 | 49 | 49 | 28 | 38 |
| | Zircon | 0 | 0 | 0 | 0 | 0 |
| | Forsterite | 0 | 0 | 0 | 0 | 0 |
| | Cordierite | 0 | 0 | 0 | 0 | 0 |
| | Glass | 49 | 49 | 49 | 70 | 60 |
| Glass composition (%) | $SiO_2$ | 43 | 43 | 43 | 43 | 38 |
| | $Al_2O_3$ | 5 | 5 | 5 | 5 | 5 |
| | MgO | 0 | 0 | 0 | 0 | 0 |
| | CaO | 4 | 4 | 4 | 4 | 4 |
| | SrO | 0 | 0 | 0 | 0 | 0 |
| | BaO | 25 | 25 | 25 | 25 | 25 |
| | PbO | 2 | 5 | 10 | 10 | 15 |
| | ZnO | 18 | 15 | 10 | 10 | 10 |
| | $B_2O_3$ | 5 | 5 | 5 | 5 | 5 |
| | $TiO_2 + ZrO_2$ | 0 | 0 | 0 | 0 | 0 |
| | $Li_2O + Na_2O + K_2O$ | 0 | 0 | 0 | 0 | 0 |
| | $CeO_2$ | 2 | 2 | 2 | 2 | 2 |
| Oxidizing agent (%) | $TiO_2$ | 0 | 0 | 0 | 0 | 0 |
| | $BaO_2$ | 0 | 0 | 0 | 0 | 0 |
| | $SnO_2$ | 0 | 0 | 0 | 0 | 0 |
| | $CaO_2$ | 0 | 0 | 0 | 0 | 0 |
| | $V_2O_5$ | 0 | 0 | 0 | 0 | 0 |
| | BV (kV/mm) | 25 | 23 | 20 | 17 | 17 |
| | IR (Ω) | $2 \times 10^{13}$ | $7 \times 10^{12}$ | $4 \times 10^{12}$ | $3 \times 10^{12}$ | $2 \times 10^{12}$ |
| | DC | 7.5 | 7.6 | 7.9 | 7.9 | 8.0 |
| | DLT (%) | 0.1 | 0.1 | 0.1 | 0.2 | 0.2 |
| Properties | TEC ($\times 10^{-7}$/°C.) | 65 | 66 | 65 | 65 | 66 |
| | FS (kg/cm$^2$) | 2100 | 2100 | 2200 | 2200 | 2400 |
| | Color | W | W | W | W | W |
| | RC (ppm) | 190 | 210 | 230 | 310 | 290 |

| Sample No. | | 41 | 42 | 43 | 44 | 45 |
|---|---|---|---|---|---|---|
| Composition (%) | Alumina | 48 | 28 | 38 | 43 | 58 |
| | Zircon | 0 | 0 | 0 | 0 | 0 |
| | Forsterite | 0 | 0 | 0 | 0 | 0 |
| | Cordierite | 0 | 0 | 0 | 0 | 0 |
| | Glass | 50 | 70 | 60 | 50 | 40 |
| Glass composition (%) | $SiO_2$ | 33 | 43 | 43 | 43 | 43 |
| | $Al_2O_3$ | 5 | 5 | 5 | 5 | 5 |
| | MgO | 0 | 0 | 0 | 0 | 0 |
| | CaO | 4 | 6 | 6 | 6 | 6 |
| | SrO | 0 | 0 | 0 | 0 | 0 |
| | BaO | 25 | 23 | 23 | 23 | 23 |
| | PbO | 20 | 0 | 0 | 0 | 0 |
| | ZnO | 10 | 17 | 17 | 17 | 17 |
| | $B_2O_3$ | 5 | 4 | 4 | 4 | 4 |
| | $TiO_2 + ZrO_2$ | 0 | 0 | 0 | 0 | 0 |
| | $Li_2O + Na_2O + K_2O$ | 0 | 0 | 0 | 0 | 0 |
| | $CeO_2$ | 2 | 0 | 2 | 2 | 2 |
| Oxidizing agent (%) | $TiO_2$ | 0 | 0.5 | 0 | 0 | 0 |
| | $BaO_2$ | 0 | 0 | 0 | 0 | 0 |
| | $SnO_2$ | 0 | 0 | 0 | 0 | 0 |
| | $CaO_2$ | 0 | 0 | 0 | 0 | 0 |
| | $V_2O_5$ | 0 | 1.5 | 0 | 0 | 0 |
| | BV (kV/mm) | 15 | 17 | 18 | 20 | 24 |
| | IR (Ω) | $1 \times 10^{12}$ | $1 \times 10^{12}$ | $5 \times 10^{12}$ | $1 \times 10^{13}$ | $4 \times 10^{13}$ |
| | DC | 8.2 | 7.2 | 7.4 | 7.5 | 7.8 |
| | DLT (%) | 0.2 | 0.3 | 0.1 | 0.1 | 0.2 |
| Properties | TEC ($\times 10^{-7}$/°C.) | 65 | 61 | 63 | 64 | 67 |
| | FS (kg/cm$^2$) | 2300 | 1500 | 1700 | 2200 | 1800 |
| | Color | W | W | W | W | W |
| | RC (ppm) | 400 | 350 | 270 | 210 | 160 |

| Sample No. | | 46 | 47 | 48 | 49 | 50 |
|---|---|---|---|---|---|---|
| Compo- | Alumina | 38 | 38 | 28 | 49 | 49 |
| sition | Zircon | 10 | 0 | 10 | 0 | 0 |

TABLE 1-continued

| | | | | | | |
|---|---|---|---|---|---|---|
| sition (%) | Forsterite | 0 | 10 | 0 | 0 | 0 |
| | Cordierite | 0 | 10 | 0 | 0 | 0 |
| | Glass | 50 | 40 | 60 | 49 | 49 |
| | $SiO_2$ | 40 | 47 | 40 | 43 | 43 |
| | $Al_2O_3$ | 7 | 6 | 7 | 5 | 5 |
| | MgO | 0 | 0 | 0 | 2 | 5 |
| Glass compo-sition (%) | CaO | 7 | 2 | 7 | 5 | 5 |
| | SrO | 0 | 0 | 0 | 0 | 0 |
| | BaO | 27 | 27 | 27 | 27 | 27 |
| | PbO | 0 | 0 | 0 | 0 | 0 |
| | ZnO | 17 | 12 | 19 | 13 | 10 |
| | $B_2O_3$ | 2 | 6 | 0 | 5 | 5 |
| | $TiO_2 + ZrO_2$ | 0 | 0 | 0 | 0 | 0 |
| | $Li_2O + Na_2O + K_2O$ | 0 | 0 | 0 | 0 | 0 |
| Oxidi-zing agent (%) | $CeO_2$ | 2 | 2 | 2 | 2 | 2 |
| | $TiO_2$ | 0 | 0 | 0 | 0 | 0 |
| | $BaO_2$ | 0 | 0 | 0 | 0 | 0 |
| | $SnO_2$ | 0 | 0 | 0 | 0 | 0 |
| | $CaO_2$ | 0 | 0 | 0 | 0 | 0 |
| | $V_2O_5$ | 0 | 0 | 0 | 0 | 0 |
| Proper-ties | BV (kV/mm) | 21 | 25 | 25 | 25 | 27 |
| | IR (Ω) | $3 \times 10^{13}$ | $5 \times 10^{13}$ | $6 \times 10^{13}$ | $2 \times 10^{13}$ | $1 \times 10^{13}$ |
| | DC | 7.2 | 7.4 | 7.9 | 7.5 | 7.5 |
| | DLT (%) | 0.3 | 0.2 | 0.1 | 0.1 | 0.1 |
| | TEC ($\times 10^{-7}/°C$.) | 59 | 57 | 60 | 65 | 66 |
| | FS (kg/cm$^2$) | 2100 | 1700 | 2000 | 2200 | 2300 |
| | Color | W | W | W | W | W |
| | RC (ppm) | 150 | 170 | 100 | 180 | 190 |

| Sample No. | | 51 | 52 | 53 | 54 | 55 |
|---|---|---|---|---|---|---|
| Compo-sition (%) | Alumina | 49 | 49 | 49 | 49 | 49 |
| | Zircon | 0 | 0 | 0 | 0 | 0 |
| | Forsterite | 0 | 0 | 0 | 0 | 0 |
| | Cordierite | 0 | 0 | 0 | 0 | 0 |
| | Glass | 49 | 49 | 49 | 49 | 49 |
| | $SiO_2$ | 40 | 38 | 43 | 43 | 40 |
| | $Al_2O_3$ | 5 | 5 | 5 | 5 | 5 |
| | MgO | 8 | 10 | 0 | 0 | 0 |
| Glass compo-sition (%) | CaO | 5 | 5 | 5 | 5 | 5 |
| | SrO | 0 | 0 | 2 | 5 | 8 |
| | BaO | 27 | 27 | 27 | 27 | 27 |
| | PbO | 0 | 0 | 0 | 0 | 0 |
| | ZnO | 10 | 10 | 13 | 10 | 10 |
| | $B_2O_3$ | 5 | 5 | 5 | 5 | 5 |
| | $TiO_2 + ZrO_2$ | 0 | 0 | 0 | 2 | 3 |
| | $Li_2O + Na_2O + K_2O$ | 0 | 0 | 0 | 0 | 0 |
| Oxidi-zing agent (%) | $CeO_2$ | 2 | 2 | 2 | 2 | 2 |
| Proper-ties | BV (kV/mm) | 28 | 29 | 25 | 25 | 26 |
| | IR (Ω) | $2 \times 10^{13}$ | $2 \times 10^{13}$ | $2 \times 10^{13}$ | $1 \times 10^{13}$ | $2 \times 10^{13}$ |
| | DC | 7.7 | 7.7 | 7.6 | 7.7 | 7.8 |
| | DLT (%) | 0.2 | 0.2 | 0.1 | 0.1 | 0.1 |
| | TEC ($\times 10^{-7}/°C$.) | 67 | 67 | 65 | 66 | 68 |
| | FS (kg/cm$^2$) | 2400 | 2400 | 2200 | 2100 | 2100 |
| | Color | W | W | W | W | W |
| | RC (ppm) | 200 | 220 | 170 | 160 | 170 |

| Sample No. | | 56 | 57 | 58 | 59 |
|---|---|---|---|---|---|
| Compo-sition (%) | Alumina | 49 | 49 | 49 | 49 |
| | Zircon | 0 | 0 | 0 | 0 |
| | Forsterite | 0 | 0 | 0 | 0 |
| | Cordierite | 0 | 0 | 0 | 0 |
| | Glass | 49 | 49 | 49 | 49 |
| | $SiO_2$ | 37 | 45 | 43 | 38 |
| | $Al_2O_3$ | 5 | 8 | 8 | 8 |
| | MgO | 0 | 0 | 0 | 0 |
| Glass compo-sition (%) | CaO | 5 | 5 | 5 | 8 |
| | SrO | 12 | 0 | 0 | 0 |
| | BaO | 27 | 20 | 15 | 18 |
| | PbO | 0 | 0 | 0 | 0 |
| | ZnO | 10 | 17 | 20 | 20 |
| | $B_2O_3$ | 5 | 5 | 5 | 5 |
| | $TiO_2 + ZrO_2$ | 5 | 0 | 0 | 0 |
| | $Li_2O + Na_2O + K_2O$ | 0 | 0 | 0 | 0 |
| Oxidi-zing | $CeO_2$ | 2 | 2 | 2 | 2 |

TABLE 1-continued

| | | | | | |
|---|---|---|---|---|---|
| agent (%) | BV (kV/mm) | 22 | 31 | 30 | 25 |
| | IR (Ω) | $1 \times 10^{13}$ | $5 \times 10^{13}$ | $5 \times 10^{13}$ | $1 \times 10^{13}$ |
| | DC | 7.8 | 7.4 | 7.2 | 7.6 |
| | DLT (%) | 0.2 | 0.1 | 0.1 | 0.1 |
| Proper-ties | TEC ($\times 10^{-7}$/°C.) | 70 | 63 | 63 | 65 |
| | FS (kg/cm$^2$) | 2200 | 2300 | 2200 | 2200 |
| | Color | W | W | W | W |
| | RC (ppm) | 200 | 150 | 150 | 180 |

| Sample No. | | Comparative Example 1 | Comparative Example 2 | Comparative Example 3 | Comparative Example 4 |
|---|---|---|---|---|---|
| Compo-sition (%) | Alumina | 50 | 40 | 50 | 49 |
| | Zircon | 0 | 10 | 0 | 0 |
| | Forsterite | 0 | 0 | 0 | 0 |
| | Cordierite | 0 | 0 | 0 | 0 |
| | Glass | 50 | 50 | 50 | 49 |
| Glass compo-sition (%) | SiO$_2$ | 40 | 45 | 35 | 35 |
| | Al$_2$O$_3$ | 15 | 15 | 15 | 15 |
| | MgO | 2 | 0 | 0 | 0 |
| | CaO | 5 | 5 | 5 | 5 |
| | SrO | 0 | 0 | 0 | 0 |
| | BaO | 18 | 20 | 20 | 20 |
| | PbO | 5 | 10 | 10 | 10 |
| | ZnO | 5 | 0 | 0 | 0 |
| | B$_2$O$_3$ | 10 | 5 | 15 | 15 |
| | TiO$_2$ + ZrO$_2$ | 0 | 0 | 0 | 0 |
| | Li$_2$O + Na$_2$O + K$_2$O | 0 | 0 | 0 | 0 |
| Oxidi-zing agent (%) | CeO$_2$ | 0 | 0 | 0 | 0 |
| | BaO$_2$ | 0 | 0 | 0 | 2 |
| | CaO$_2$ | 0 | 0 | 0 | 0 |
| | BV (kV/mm) | 1.1 | 1.2 | 0.5 | 1.5 |
| | IR (Ω) | $2 \times 10^{11}$ | $1 \times 10^{12}$ | $4 \times 10^{10}$ | $5 \times 10^{11}$ |
| | DC | 7.3 | 7.5 | 6.9 | 7.4 |
| | DLT (%) | 0.7 | 0.9 | 0.4 | 0.4 |
| Proper-ties | TEC ($\times 10^{-7}$/°C.) | 59 | 60 | 57 | 60 |
| | FS (kg/cm$^2$) | 1300 | 1000 | 900 | 1100 |
| | Color | B | B | B | B |
| | RC (ppm) | 2300 | 1700 | 3100 | 630 |

| Sample No. | | Comparative Example 5 | Comparative Example 6 | Comparative Example 7 | Comparative Example 8 |
|---|---|---|---|---|---|
| Compo-sition (%) | Alumina | 49 | 45 | 25 | 20 |
| | Zircon | 0 | 0 | 0 | 0 |
| | Forsterite | 0 | 0 | 0 | 0 |
| | Cordierite | 0 | 0 | 0 | 0 |
| | Glass | 49 | 50 | 50 | 50 |
| Glass compo-sition (%) | SiO$_2$ | 35 | 35 | 35 | 35 |
| | Al$_2$O$_3$ | 15 | 15 | 15 | 15 |
| | MgO | 0 | 0 | 0 | 0 |
| | CaO | 5 | 5 | 5 | 5 |
| | SrO | 0 | 0 | 0 | 0 |
| | BaO | 20 | 20 | 20 | 20 |
| | PbO | 10 | 10 | 10 | 10 |
| | ZnO | 0 | 0 | 0 | 0 |
| | B$_2$O$_3$ | 15 | 15 | 15 | 15 |
| | TiO$_2$ + ZrO$_2$ | 0 | 0 | 0 | 0 |
| | Li$_2$O + Na$_2$O + K$_2$O | 0 | 0 | 0 | 0 |
| Oxidi-zing agent (%) | CeO$_2$ | 0 | 0 | 0 | 30 |
| | BaO$_2$ | 0 | 5 | 25 | 0 |
| | CaO$_2$ | 2 | 0 | 0 | 0 |
| | BV (kV/mm) | 3.0 | 5.8 | 28 | 31 |
| | IR (Ω) | $5 \times 10^{11}$ | $1 \times 10^{12}$ | $8 \times 10^{12}$ | $1 \times 10^{13}$ |
| | DC | 7.4 | 7.4 | 8.3 | 8.5 |
| | DLT (%) | 0.3 | 0.4 | 1.3 | 3.4 |
| Proper-ties | TEC ($\times 10^{-7}$/°C.) | 61 | 62 | 70 | 74 |
| | FS (kg/cm$^2$) | 1200 | 2000 | 900 | 900 |
| | Color | B | W | W | W |
| | RC (ppm) | 810 | 520 | 190 | 50 |

| Sample No. | | Comparative Example 9 | Comparative Example 10 | Comparative Example 11 |
|---|---|---|---|---|
| Compo-sition | Alumina | 49 | 49 | 49 |
| | Zircon | 0 | 0 | 0 |
| | Forsterite | 0 | 0 | 0 |

TABLE 1-continued

| | | | | |
|---|---|---|---|---|
| (%) | Cordierite | 0 | 0 | 0 |
| | Glass | 49 | 49 | 49 |
| | SiO$_2$ | 43 | 43 | 43 |
| | Al$_2$O$_3$ | 5 | 5 | 5 |
| | MgO | 0 | 0 | 0 |
| Glass | CaO | 5 | 5 | 5 |
| compo- | SrO | 0 | 0 | 0 |
| sition | BaO | 27 | 27 | 22 |
| (%) | PbO | 0 | 0 | 0 |
| | ZnO | 10 | 5 | 0 |
| | B$_2$O$_3$ | 5 | 5 | 5 |
| | TiO$_2$ + ZrO$_2$ | 0 | 0 | 0 |
| | Li$_2$O + Na$_2$O + K$_2$O | 0 | 0 | 0 |
| | Bi$_2$O$_3$ | 5 | 10 | 20 |
| Oxidi- | CeO$_2$ | 0 | 0 | 2 |
| zing | BaO$_2$ | 0 | 1 | 0 |
| agent (%) | CaO$_2$ | 0 | 1 | 0 |
| | BV (kV/mm) | 15 | 14 | 11 |
| | IR (Ω) | 1 × 10$^{12}$ | 6 × 10$^{11}$ | 4 × 10$^{11}$ |
| | DC | 7.4 | 7.5 | 7.5 |
| | DLT (%) | 0.1 | 0.2 | 0.3 |
| Proper- | TEC (× 10$^{-7}$/°C.) | 64 | 66 | 68 |
| ties | FS (kg/cm$^2$) | 1700 | 1100 | 900 |
| | Color | W | B | B |
| | RC (ppm) | 440 | 740 | 920 |

| Sample No. | | Comparative Example 12 | Comparative Example 13 | Comparative Example 14 |
|---|---|---|---|---|
| | Alumina | 49 | 49 | 49 |
| Compo- | Zircon | 0 | 0 | 0 |
| sition | Forsterite | 0 | 0 | 0 |
| (%) | Cordierite | 0 | 0 | 0 |
| | Glass | 49 | 49 | 49 |
| | SiO$_2$ | 43 | 43 | 43 |
| | Al$_2$O$_3$ | 5 | 5 | 5 |
| | MgO | 0 | 0 | 0 |
| Glass | CaO | 5 | 5 | 5 |
| compo- | SrO | 0 | 0 | 0 |
| sition | BaO | 12 | 7 | 2 |
| (%) | PbO | 0 | 0 | 0 |
| | ZnO | 15 | 15 | 15 |
| | B$_2$O$_3$ | 20 | 25 | 30 |
| | TiO$_2$ + ZrO$_2$ | 0 | 0 | 0 |
| | Li$_2$O + Na$_2$O + K$_2$O | 0 | 0 | 0 |
| | Bi$_2$O$_3$ | 0 | 0 | 0 |
| Oxidi- | CeO$_2$ | 2 | 2 | 2 |
| zing | BaO$_2$ | 0 | 0 | 0 |
| agent (%) | CaO$_2$ | 0 | 0 | 0 |
| | BV (kV/mm) | 10 | 2.3 | 1.4 |
| | IR (Ω) | 1 × 10$^{12}$ | 5 × 10$^{11}$ | 2 × 10$^{11}$ |
| | DC | 7.3 | 7.1 | 6.9 |
| | DLT (%) | 0.2 | 0.5 | 1.0 |
| Proper- | TEC (× 10$^{-7}$/°C.) | 61 | 60 | 57 |
| ties | FS (kg/cm$^2$) | 1500 | 1000 | 800 |
| | Color | B | B | B |
| | RC (ppm) | 550 | 710 | 1050 |

TABLE 2

| Sample No. | | Comparative Example 21 | Comparative Example 22 |
|---|---|---|---|
| | Alumina | 49 | 49 |
| Compo- | Zircon | 0 | 0 |
| sition | Forsterite | 0 | 0 |
| (%) | Cordierite | 0 | 0 |
| | Glass | 49 | 49 |
| | SiO$_2$ | 35 | 35 |
| | Al$_2$O$_3$ | 15 | 15 |
| | MgO | 0 | 0 |
| Glass | CaO | 5 | 5 |
| compo- | SrO | 0 | 0 |
| sition | BaO | 20 | 20 |
| (%) | PbO | 10 | 10 |
| | ZnO | 0 | 0 |
| | B$_2$O$_3$ | 15 | 15 |
| | TiO$_2$ + ZrO$_2$ | 0 | 0 |
| | Li$_2$O + Na$_2$O + K$_2$O | 0 | 0 |
| Oxidi- | CeO$_2$ | 0 | 0 |
| zing | BaO$_2$ | 2 | 0 |
| agent (%) | CaO$_2$ | 0 | 2 |
| | BV (kV/mm) | 15 | 20 |
| | IR (Ω) | 6 × 10$^{13}$ | 9 × 10$^{13}$ |
| | DC | 7.5 | 7.6 |
| | DLT (%) | 0.2 | 0.1 |
| Proper- | TEC (× 10$^{-7}$/°C.) | 60 | 61 |
| ties | FS (kg/cm$^2$) | 2100 | 2300 |
| | Color | W | W |

TABLE 2-continued

| Sample No. | Comparative Example 21 | Comparative Example 22 |
|---|---|---|
| RC (ppm) | 220 | 250 |

*BV Breakdown voltage (kV/mm)
IR Insulation resistance (Ω)
DC Dielectric constant
DLT Dielectric loss tangent (%)
TEC Thermal expansion coefficient ($\times 10^{-7}/°C$)
FS Flexural strength (kg/cm$^2$)
W C.) (no carbon residue)
B Black (much carbon residue)
RC Residual carbon (ppm)

The composition of the present invention can be sintered at a low temperature in a low oxygen concentration to form a substrate having excellent electrical properties, thermal expansion coefficient and flexural strength, and thus is suitable for a multi-layer substrate which is subjected to sintering of e.g. a Cu paste in a non-oxidizing atmosphere to form a conductive pattern.

Particularly preferred is a composition comprising from 1 to 10% of $CeO_2$ as an oxidizing agent and glass powder comprising from 40 to 47% of $SiO_2$, from 2 to 7% of $Al_2O_3$, from 0 to 7% of MgO, from 2 to 7% of CaO, from 0 to 10% of SrO, from 22 to 28% of BaO, from 0 to 18% of PbO, from 12 to 20% of ZnO, from 4 to 7% of $B_2O_3$, from 0 to 4% of $TiO_2+ZrO_2$ and from 0 to 3% of $Li_2O+Na_2O+K_2O$, since it has excellent dielectric constant, dielectric loss tangent, binder-removal effect and flexural strength.

What is claimed is:

1. A substrate prepared by forming a green sheet from a slurry comprising an inorganic component and an organic binder, printing a copper paste in a predetermined pattern on the green sheet, and sintering the printed green sheet in a substantially non-oxidizing atmosphere, wherein said inorganic component comprises from 30 to 70% by weight of glass powder, from 28 to 70% by weight of refractory filler powder and 0.01 to 20% by weight of an oxidizing agent "selected from the group consisting of $CeO_2$, $TiO_2$, $BaO_2$ $SnO_2$, $CaO_2$ and $V_2O_5$," said glass powder consisting essentially of from 38 to 48% by weight of $SiO_2$, from 1 to 8% by weight of $Al_2O_3$, from 0 to 10% by weight of MgO, from 18 to 28% by weight of BaO, from 1 to 8% by weight of CaO, from 0 to 15% by weight of SrO, from 0.5 to 15% by weight of $B_2O_3$, from 0 to 20% by weight of PbO, from 10 to 20% by weight of ZnO, from 0 to 7% by weight of $TiO_2$ plus $ZrO_2$ and from 0 to 5% by weight of $Li_2O$ plus $Na_2O$ plus $K_2O$, and said refractory filler powder comprising from 20 to 60% by weight of alumina, from 0 to 40% by weight of zircon, from 0 to 30% by weight of cordierite and from 0 to 30% by weight of forsterite.

2. The substrate according to claim 1, wherein the oxidizing agent is $CeO_2$ in an amount of from 1 to 10% by weight, and the glass powder consists essentially of from 40 to 47% by weight of $SiO_2$, from 2 to 7% by weight of $Al_2O_3$, from 0 to 7% by weight of MgO, from 2 to 7% by weight of CaO, from 0 to 10% by weight of SrO, from 22 to 28% by weight of BaO, from 0 to 18% by weight of PbO, from 12 to 20% by weight of ZnO, from 1 to 8% by weight of $B_2O_3$, from 0 to 4% by weight of $TiO_2$ plus $ZrO_2$ and from 0 to 3% by weight of $Li_2O$ plus $Na_2O$ plus $K_2O$.

3. The substrate according to claim 2, wherein the glass powder consists essentially of from 40 to 47% by weight of $SiO_2$, from 2 to 7% by weight of $Al_2O_3$, from 2 to 7% by weight of MgO, from 2 to 7% by weight of CaO, from 2 to 10% by weight of SrO, from 22 to 28% by weight of BaO, from 1 to 18% by weight of PbO, from 12 to 20% by weight of ZnO, from 1 to 8% by weight of $B_2O_3$, from 0 to 4% by weight of $TiO_2$ plus $ZrO_2$ and from 0 to 3% by weight of $Li_2O$ plus $Na_2O$ plus $K_2O$.

4. The substrate according to claim 2, wherein the glass powder consists essentially of from 40 to 47% by weight of $SiO_2$, from 2 to 7% by weight of $Al_2O_3$, from 2 to 7% by weight of MgO, from 2 to 7% by weight of CaO, from 22 to 28% by weight of BaO, from 1 to 18% by weight of PbO, from 12 to 20% by weight of ZnO, from 1 to 8% by weight of $B_2O_3$, from 0 to 4% by weight of $TiO_2$ plus $ZrO_2$ and from 0 to 3% by weight of $Li_2O$ plus $Na_2O$ plus $K_2O$.

5. A composition for a ceramic substrate comprising from 30 to 70% by weight of glass powder, from 28 to 70% by weight of refractory filler powder and an oxidizing agent, said glass powder consisting essentially of from 38 to 48% by weight of $SiO_2$, from 1 to 8% by weight of $Al_2O_3$, from 0 to 10% by weight of MgO, from 18 to 28% by weight of BaO, from 1 to 8% by weight of CaO, from 0 to 15% by weight of SrO, from 0.5 to 15% by weight of $B_2O_3$, from 0 to 20% by weight of PbO, from 10 to 20% by weight of ZnO, from 0 to 7% by weight of $TiO_2$ plus $ZrO_2$ and from 0 to 5% by weight of $Li_2O$ plus $Na_2O$ plus $K_2O$, and said refractory filler powder comprising from 20 to 60% by weight of alumina, from 0 to 40% by weight of zircon, from 0 to 30% by weight of cordierite and from 0 to 30% by weight of forsterite.

6. The composition according to claim 5, wherein the oxidizing agent is $CeO_2$ in an amount of from 1 to 10% by weight, and the glass powder consists essentially of from 40 to 47% by weight of $SiO_2$, from 2 to 7% by weight of $Al_2O_3$, from 0 to 7% by weight of MgO, from 2 to 7% by weight of CaO, from 0 to 10% by weight of SrO, from 22 to 28% by weight of BaO, from 0 to 18% by weight of PbO, from 12 to 20% by weight of ZnO, from 1 to 8% by weight of $B_2O_3$, from 0 to 4% by weight of $TiO_2$ plus $ZrO_2$ and from 0 to 3% by weight of $Li_2O$ plus $Na_2O$ plus $K_2O$.

7. The composition according to claim 6, wherein the glass powder consists essentially of from 40 to 47% by weight of $SiO_2$, from 2 to 7% by weight of $Al_2O_3$, from 2 to 7% by weight of MgO, from 2 to 7% by weight of CaO, from 2 to 10% by weight of SrO, from 22 to 28% by weight of BaO, from 1 to 18% by weight of PbO, from 12 to 20% by weight of ZnO, from 1 to 8% by weight of $B_2O_3$, from 0 to 4% by weight of $TiO_2$ plus $ZrO_2$ and from 0 to 3% by weight of $Li_2O$ plus $Na_2O$ plus $K_2O$.

8. The composition according to claim 6, wherein the glass powder consists essentially of from 40 to 47% by weight of $SiO_2$, from 2 to 7% by weight of $Al_2O_3$, from 2 to 7% by weight of MgO, from 2 to 7% by weight of CaO, from 22 to 28% by weight of BaO, from 1 to 18% by weight of PbO, from 12 to 20% by weight of ZnO, from 1 to 8% by weight of $B_2O_3$, from 0 to 4% by weight of $TiO_2$ plus $ZrO_2$ and from 0 to 3% by weight of $Li_2O$ plus $Na_2O$ plus $K_2O$.

9. The composition according to claim 6, wherein the glass powder consists essentially of from 40 to 47% by weight of $SiO_2$, from 2 to 7% by weight of $Al_2O_3$, from 2 to 7% by weight of CaO, from 2 to 10% by weight of SrO, from 22 to 28% by weight of BaO, from 1 to 18% by weight of PbO, from 12 to 20% by weight of ZnO, from 1 to 8% by weight of $B_2O_3$, from 0 to 4% by weight of $TiO_2$ plus $ZrO_2$ and from 0 to 3% by weight of $Li_2O$ plus $Na_2O$ plus $K_2O$.

* * * * *